(12) United States Patent
Hoang

(10) Patent No.: US 6,373,142 B1
(45) Date of Patent: Apr. 16, 2002

(54) METHOD OF ADDING FILLER INTO A NON-FILLED UNDERFILL SYSTEM BY USING A HIGHLY FILLED FILLET

(75) Inventor: Lan H. Hoang, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/440,492

(22) Filed: Nov. 15, 1999

(51) Int. Cl.[7] .................. H01L 23/48; H01L 23/52; H01L 29/40
(52) U.S. Cl. .................. 257/783; 257/795; 257/787
(58) Field of Search .................. 257/780, 781, 257/782, 783, 787, 789, 795; 438/644, 654, 118, 127, 119

(56) References Cited

U.S. PATENT DOCUMENTS

| 5,001,542 A | * | 3/1991 | Tsukagoshi et al. |
| 5,907,190 A | * | 5/1999 | Ishikawa et al. |
| 5,981,313 A | * | 11/1999 | Tanaka |
| 5,982,631 A | * | 11/1999 | Bowles et al. |
| 6,049,038 A | * | 4/2000 | Suzuki |
| 6,121,689 A | * | 9/2000 | Capote et al. |
| 6,133,639 A | * | 10/2000 | Kovac et al. |
| 6,137,183 A | * | 10/2000 | Sako |

\* cited by examiner

*Primary Examiner*—Sheila V. Clark
(74) *Attorney, Agent, or Firm*—Beyer Weaver & Thomas, LLP

(57) ABSTRACT

The present invention provides a semiconductor chip package with a fillet which contains a high percentage of a filler material by weight and a method of assembly with a semiconductor chip package for adding filler material to a non-filled or low-filled underfill system. The method of assembly produces a chip package where the concentration of filler material within the underfill material between the chip and the package substrate may be varied from location to location within the underfill material. The filler material increases the mechanical rigidity of the underfill material after it has hardened. Thus, using the approach of the present invention, the percentage of filler material may be increased in regions of the underfill material where the mechanical stresses require a greater mechanical rigidity. The present invention may be applicable to increasing the reliability of chip packages where the chip and the package substrate are separated by a gap about 25–50 microns wide.

32 Claims, 6 Drawing Sheets

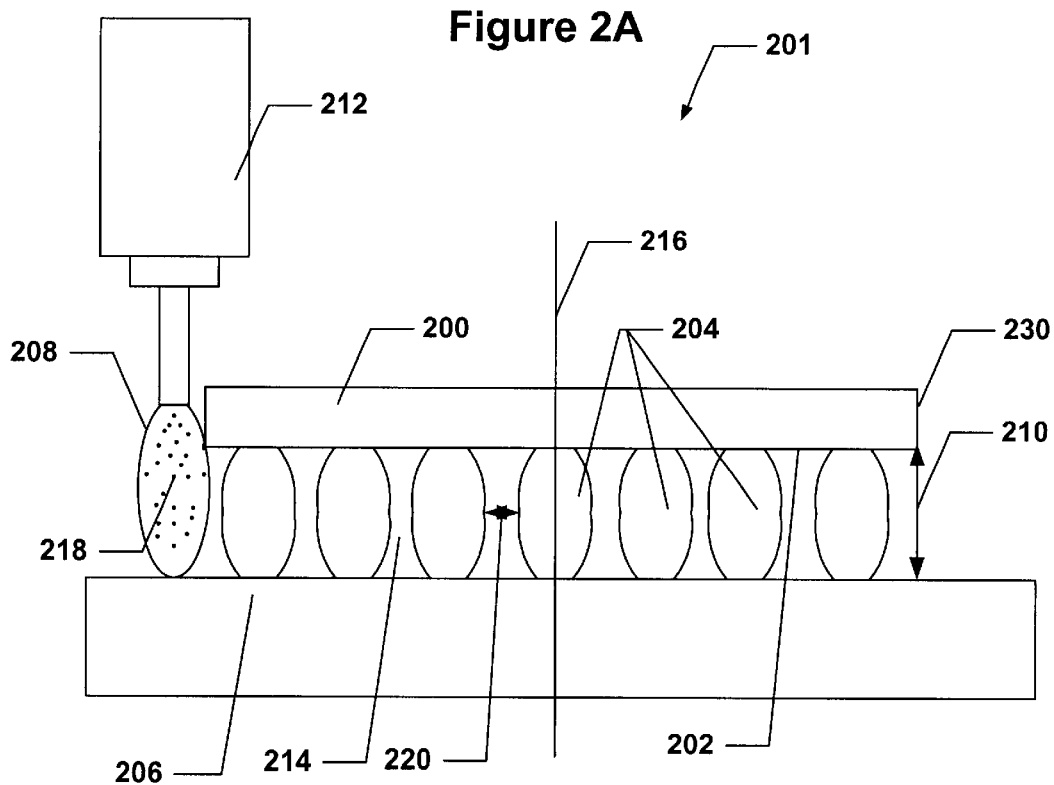
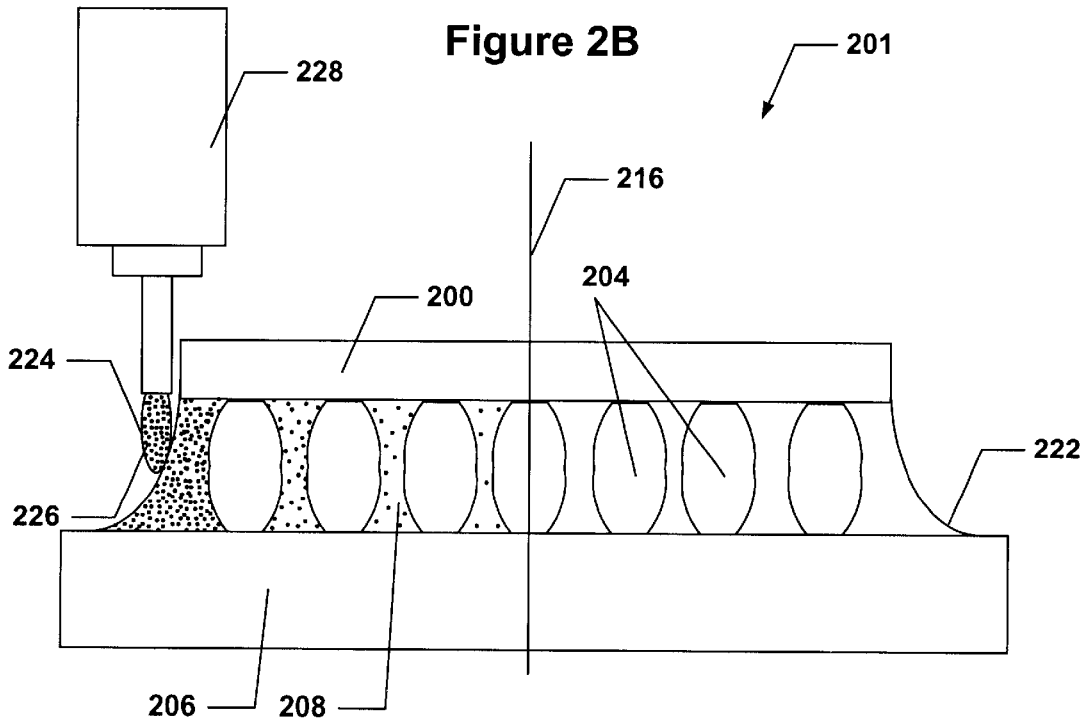

METHOD OF ADDING FILLER INTO A NON-FILLED UNDERFILL SYSTEM BY USING A HIGHLY FILLED FILLET

BACKGROUND OF THE INVENTION

This invention relates generally to semiconductor chip device assembly, and in particular to flip chip package construction. More specifically, the invention relates to a method of adding filler material to non-filled or low-filled underfill material between the semiconductor chip and substrate using a highly filled fillet during chip packaging.

In semiconductor device assembly, a semiconductor chip (also referred to as an integrated circuit (IC) chip or "die") may be bonded directly to a packaging substrate, without the need for a separate leadframe or for separate I/O connectors (e.g. wire or tape). Such chips are formed with ball-shaped beads or bumps of solder affixed to their I/O bonding pads. During packaging, the chip is "flipped" onto its active circuit surface so that the solder balls form electrical connections directly between the chip and conductive traces on a packaging substrate. Semiconductor chips of this type are commonly called "flip chips".

The initial packaging of the chip occurs in two steps. First, the chip is electrically connected to the substrate and then the chip is mechanically (or adhesively) bonded to the substrate. The chip is electrically bonded to the substrate by applying solder balls to the active circuit surface of the chip. As an example, the solder may be composed of a low melting point eutectic material or a high lead material. Prior to bonding the chip to a substrate, solder flux is applied to either the active surface of the chip or the packaging substrate surface. The flux serves primarily to aid the flow of the solder, such that the solder balls make good contact with traces on the packaging substrate. It may be applied in any of a variety of methods, including brushing or spraying, or dipping the chip into a thin film, thereby coating the solder balls with flux. The flux generally has an acidic component, which removes oxide barriers from the solder surfaces, and an adhesive quality, which helps to prevent the chip from moving on the packaging substrate surface during the assembly process. The flux serves primarily to aid the flow of the solder, such that the solder balls make good contact with traces on the packaging substrate. It should be understood that this electrical bonding also provides a mechanical bond between the chip and substrate.

After the flux is applied, the chip is aligned with and placed onto a placement site on the packaging substrate such that the chip's solder balls are aligned with electrical traces on the substrate. The substrate is typically composed of a laminate or organic material, such as fiber glass, PTFE (such as Teflon™, available from Gore, Eau Claire, Wis.) BT Resin, epoxy laminates or ceramic-plastic composites. Heat, for example, to a temperature of about 220° C., is applied to one or more of the chip and the packaging substrate, causing the solder balls to reflow and form electrical connections between the chip and the packaging substrate. Then, the remaining flux residue is substantially removed in a cleaning step, for instance by washing with an appropriate solvent.

At this point, the mechanical (adhesive) bonding procedure can begin. FIGS. 1A and B illustrate the standard underfill method for mechanically bonding the chip and the substrate after the electrical connections between the chip and substrate have been made. In FIG. 1A which is a cross-sectional, side view, a chip 100 with an active circuit surface 102 has been electrically connected to a substrate surface 106 via the solder balls 104. It should be noted that this figure and the figures that follow are intended to be representative and, for example, do not show the solder balls 104 in proportion to the chip 100. As an example, the chip 100 may have dimensions on the order of 0.5×0.5 inch (1 inch=2.54 cm) whereas the unbonded solder balls 104 may have a diameter on the order of 4 to 5 mils (1 mil=10$^{-3}$ inch=0.0254 mm) or less. An underfill material, typically a thermo-set epoxy 108, such as is available from Hysol Corporation of Industry, Calif. (product numbers 4511 and 4527), Ablestik Laboratories of Rancho Domingo, Calif., and Johnson Matthey Electronics of San Diego, Calif., is dispensed into the remaining space (or "gap") 110 between the chip 100 and the substrate 106. In current designs, a representative gap is between 50–75 microns. In a typical procedure, a bead of thermo-set epoxy 108, is applied along one edge of the chip using an injection mechanism 112 where it is drawn under the chip 100 by capillary action until it completely fills the gap 110 between the chip 100 and the packaging substrate 106. To assist the flow, slight heating of the packaging substrate after dispensing of the underfill material 108 may be used. In some cases, the underfill material flow is further assisted by vacuum, or, alternatively, by injection of the epoxy into the gap.

To change the coefficient of thermal expansion of the underfill material, a filler material such as alumina or silica is typically added to the underfill material 108. The spots in the underfill material 108 represent a constant percentage by weight of filler material particles. The filler material, which lowers the coefficient of thermal expansion of the epoxy, increases the rigidity of the cured epoxy which increases the mechanical strength of the bond between the chip and substrate. Thus, the reliability of the packaged system is increased. However, adding filler material to the underfill material reduces the flow rate during the process by which the epoxy is drawn under the chip by capillary action. When the gap between the chip and substrate decreases, the reduced flow rate under the chip increases the possibility of the formation of gaps or voids in the underfill material which reduces the reliability of the packaged chip. An underfill material without any filler material has the best flow rate and thus produces the least amount of gaps and voids. However, using a non-filled underfill material to bond the chip and substrate leads to poor packaging reliability under temperature cycling.

In another mechanical bonding process called no-flow underfill, the underfill material 108 is placed on the package substrate underneath the center of the chip 100, before the chip 100 is electrically connected to the substrate 106. In this process, the mechanical bonding and electrical bonding occur in one step. In this process, it is undesirable to add filler material to the underfill material because the filler material adversely affects the electrical connections between the chip and the substrate. Thus, this process is limited to packaging applications where a strong mechanical bond is not required such as for small chips.

As shown in FIG. 1B, after the epoxy 108 has bled through the gap 110, a separate bead of epoxy 114 with the same composition as the underfill material is dispensed and bonded around the perimeter of the chip 100 to create a fillet 112. The fillet adds additional strength and creates a clean edge around the chip. Thereafter, the epoxy (both the underfill and perimeter bonding epoxy, if any) are cured by heating the substrate and chip to an appropriate curing temperature. In this manner the process produces a mechanically, as well as electrically, bonded semiconductor chip assembly, with the underfill material 108 allowing a redistribution of the stress at the connection between the chip 100 and the substrate 106 from the solder 104 joints only to the entire sub-chip area.

Currently, one disadvantage of the standard underfill method for filling the gap between the chip and the substrate for packaging is that as the gap size approaches 25 microns or less, which is anticipated as requirement for chips in the near future, it becomes very difficult to use underfill material with a high percentage of filler material. With small gaps approaching 25 microns, an underfill material with a high percentage of filler material produces gaps and voids in the underfill material which reduces the mechanical rigidity of the system. In addition, the voids may allow electric shorts between two adjacent solder joints. However, to reduce the gaps and voids, an underfill material with a lower percentage of filler material must be used which also reduces the mechanical rigidity of the system. Thus, a method for adding filler material into a non-filled or low filled underfill system would be desirable feature for mechanically bonding a chip to a substrate.

SUMMARY OF THE INVENTION

To achieve the foregoing, the present invention provides a semiconductor chip package with a fillet which contains a high percentage of a filler material by weight and a method of assembly with a semiconductor chip package for adding filler material to a non-filled or low-filled underfill system. The method of assembly produces a chip package where the concentration of filler material within the underfill material between the chip and the package substrate may be varied from location to location within the underfill material. The filler material increases the mechanical rigidity of the underfill material after it has hardened. Further, the filler material may help to match the coefficients of thermal expansion between the chip and the underfill material after it has hardened which reduces the mechanical stress at the interface between the underfill material and the chip. Thus, using the approach of the present invention, the percentage of filler material may be increased in regions of the underfill material where the mechanical stresses require a greater mechanical rigidity. The present invention may be applicable to increasing the reliability of chip packages where the chip and the package substrate are separated by a gap about 25–50 microns wide.

In a preferred embodiment, the present invention provides a semiconductor package including a packaging substrate having a top side and an underside and a semiconductor chip having an active surface with a center, a top surface and a perimeter. The active surface of the chip is electrically and mechanically bonded to the top side of the substrate. The semiconductor package also includes an underfill material between the chip and the substrate where the underfill material contains a percentage of filler material. Further, the semiconductor package includes a second material on top of the substrate and around the perimeter of the chip where the second material contains a higher percentage of filler material than the underfill material between the chip and the substrate. The second material on top of the substrate and around the perimeter of the chip may be used to form a fillet. Both the underfill material and the second material may be a thermo-set epoxy.

Typically, the filler material used in the semiconductor package may be alumina or silica. The percentage of filler material used in the underfill material or the second material may be varied. For example, the underfill material may contain from 0–30% filler material by weight and the second material may contain from 30–85% filler material by weight.

The concentration of filler material in the underfill material may vary from location to location within the semiconductor package to form various gradients. For example, the concentration of filler material may vary between the concentration of filler material on top of the substrate and around the perimeter of the chip and the concentration of filler material near the center of the chip. As another example, the concentration of filler material may vary between the concentration of filler material near the active surface of the chip and the concentration of filler material near the top of the package substrate.

The invention also provides a method of making a semiconductor package. The method includes providing a packaging substrate having a top side and an underside and a semiconductor chip having an active surface with a center, a perimeter, and a top surface where the active surface of the semiconductor chip is electrically bonded to electrical traces on the top side of the packing substrate. Then, an underfill material may be dispensed between the chip and the substrate where the underfill material contains a percentage of filler material. Next, a second material may be dispensed on the top of the substrate and around the perimeter of the chip where the second material contains a higher percentage of filler material than the underfill material between the chip and the substrate. Finally, the underfill material and the second material are cured. In another embodiment of the present invention, the underfill material may be dispensed prior to electrical bonding where the underfill material does not contain a filler material. Both methods may be applied for semiconductor packages where the chip and substrate are separated by a gap of about 25–50 microns.

These and other features and advantages of the present invention are described below with reference to the drawings.

BRIEF DESCRIPTION OF THE DRAWINGS

FIGS. 2A–B depict cross-sectional views of stages in the packaging of a chip using an underfill method with a highly filled fillet to add filler material to the underfill material in accordance with a preferred embodiment of the present invention.

DESCRIPTION OF THE PREFERRED EMBODIMENTS

Figure 1A:
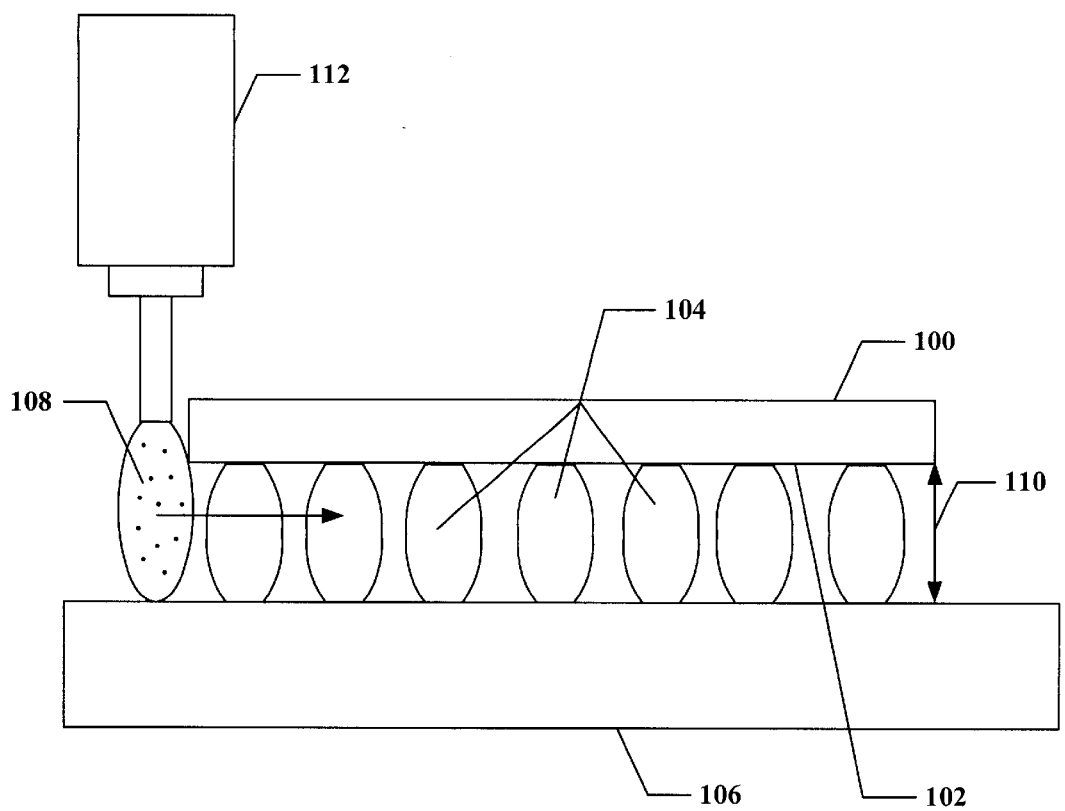
FIGS. 1A–B depict cross-sectional views of stages in the packaging of a chip using a standard underfill method.
Figure 1B:
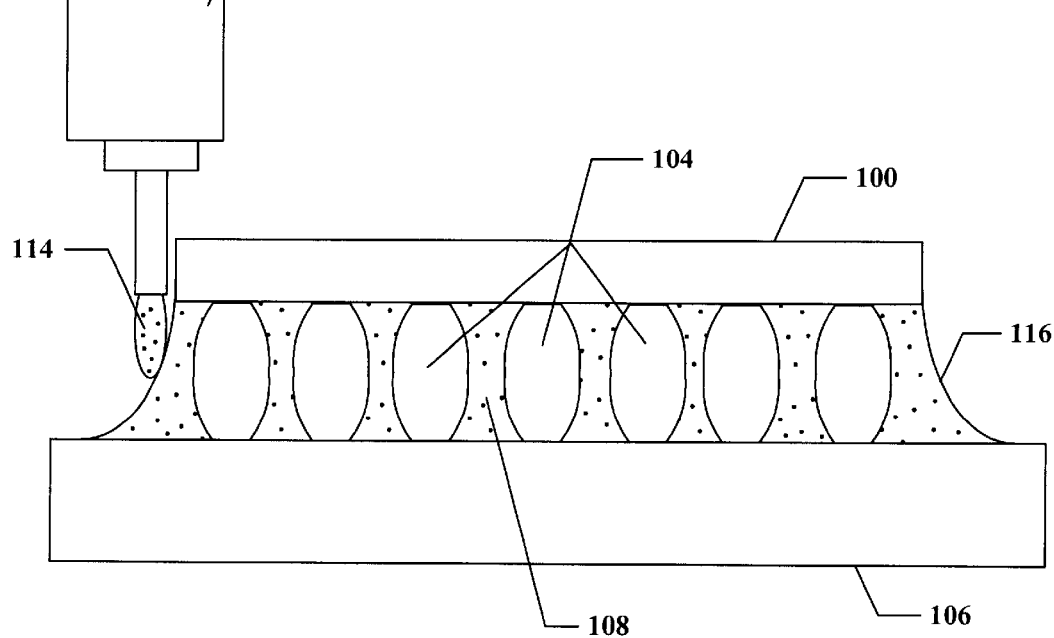

In a preferred embodiment, the present invention provides a semiconductor package that contains an underfill material between a chip and a packaging substrate that is filled with a filler material to improve the bond strength between the chip and the substrate under thermal stress. The filler material is added to the underfill between the chip and the packaging substrate by applying a fillet around the chip perimeter with a percentage of filler material which is higher than the filler material in the underfill initially provided between the chip and the substrate. This method is able to produce an underfill with a high percentage of filler material within the gap between the chip and the packaging substrate for gaps which are substantially thinner than is currently obtainable, preferably for gaps between 25–50 microns. This method for adding filler material to the underfill may be applied to packaging methods that use either a flow underfill method or a no flow underfill method to add underfill between the chip and packaging substrate.

FIG. 2A shows a cross-sectional view of a semiconductor chip package 201 in accordance with a preferred embodiment of the present invention. The chip 200 is electrically bonded to a packaging substrate 206 with the active surface of the chip 202 electrically connected to the substrate 206 using solder balls 204. This portion of the chip package is assembled using conventional materials and methods.

Before underfill is added, the space between the chip 200, the packaging substrate 206 and the solder balls 204 is space. The spaces 214 between the solder balls 204, the chip 200 and the packaging substrate 206 may vary in dimension according to the number of electrical connections on the chip which require solder balls, the size of the solder balls 204, the size of the gap 210 between the chip 200 and the packaging substrate and the distance between adjacent solder balls called the bump pitch 220. In an underfill flow process, an underfill material 208 may be added into these spaces 214 by applying a bead of liquid underfill material around a portion of the perimeter of the chip 200 and on top of the substrate 206. The bead of liquid underfill material 208 may be placed using an injection mechanism 212. The injection mechanism 212 may include a needle, syringe or any other device capable of dispensing a bead of underfill material 208 around a portion of the chip perimeter.

The underfill material 208 is drawn through the empty spaces 214 by capillary action. A vacuum may be applied during the process to facilitate the flow of the underfill material. In addition, the substrate 206 may be slightly heated, for example, to a temperature of about 80–100° C. After curing the liquid underfill material at a temperature of about 150° C. for around 120 minutes, the underfill material hardens into a solid. However, the curing temperature is not necessarily a constant and may be varied as a function of time. Typically, the underfill material, is a thermo-set epoxy 208, such as is available from Hysol Corporation of Industry, Calif., Ablestik Laboratories of Rancho Domingo, Calif., and Johnson Matthey Electronics of San Diego, Calif.

The spaces between the chip 200 and the packaging substrate 206 are filled with an underfill material 208 to increase the bond strength of the electrical connections between the chip and the packaging substrate under thermal stress. Typically, the coefficient of thermal expansion (CTE) is lower for the chip material 200 than for the substrate material 206. For example, the chip 200 may possess a coefficient of thermal expansion of around 5 parts per million/K while the substrate 206 may posses a CTE of around 18–20 parts per million/K. Thus, during thermal cycling, the chip 200 with the lower CTE will expand less than the substrate with the higher CTE. Further, the underfill material 208 typically has a higher CTE than the chip 200.

The different rates of expansion under temperature for the chip 200 and substrate 206 places mechanical stress on the solder balls 204 which electrically connect the chip and substrate. Under temperature cycling, the mechanical stress induced by the different expansion rates of the chip and substrate may cause one or more electrical connections to break which may cause the chip 200 to malfunction during operation. The amount of the expansion of the chip 200 and hence the mechanical stresses on the solder balls 204 is a function of the distance from the center of the chip 216. The maximum expansion of the chip and the maximum mechanical stresses occur on the perimeter 230 of the chip and decrease to a minimum at the center of the chip 216. Thus, the stress at the perimeter 230 of the chip increases as the distance from the chip center 216 increases with increasing chip sizes.

To improve the rigidity of the hardened underfill material 208, a filler material 218, including but not limited to alumina or silica, may be added to the liquid underfill material during the underfill flow process. If present, the filler particles 218 may vary in size from about 0.1 to 15 microns. The mechanical rigidity of the hardened underfill material with the filler material 218 is higher than the mechanical rigidity of the hardened underfill material without filler material. Further, the filler material 218 may be added to the underfill material 208 to lower the CTE of the underfill material and better match the CTE of the chip 200. A better match between the CTE of the chip 200 and the CTE of the underfill material 208 lowers the mechanical stress at the interface between the chip and the underfill material. A higher mechanical rigidity in the underfill material and a better match between the CTE of the chip and the CTE of the underfill material improves the reliability of the electrical bonds between the chip 200 and the substrate 206. Thus, a percentage by weight of filler material 218 may be added to the liquid underfill material 208 during the underfill flow process.

The percentage of filler material 218 added to the underfill material 208 may depend on the desired flow properties of the underfill material, the desired rigidity of the underfill material and the desired process time for adding the flow material. The percentage by weight of filler material added to the liquid underfill material may typically be between 0–30% but is not limited to this range. The influences of each of the flow properties, rigidity and process time on the percentage of the added filler material are described individually in the following paragraphs. In application of the underfill flow method, these factors may be considered individually or in any combination to determine a percentage of filler material to add to the underfill material during the underfill flow process.

One objective of the flow underfill process is to fill all the gaps and spaces between the chip 200 and substrate 206 with the underfill material 208 leaving a minimum number of gaps and voids. The addition of filler particles 218 into the liquid underfill material 208 increases the viscosity of the liquid underfill material. An increased viscosity for the liquid underfill material increases the likelihood of gaps in voids in the underfill material between the chip and substrate which reduces the mechanical rigidity of the underfill material after hardening. As the bump pitch 220 is reduced beyond 225 microns, or the gap 210 between the chip and the substrate is reduced below 50–75 microns and approaching 25 microns or the area of the chip increases, the likely hood of gaps and voids increases. The maximum flow rate and the most uniform flow front for the liquid underfill material occurs when no filler material added. Thus, in one embodiment of the present invention, the amount of filler material added to the underfill material during the flow process may be decreased or eliminated to minimize the number of gaps and voids in the underfill material between the chip and substrate.

Further, during the underfill flow process, the process time may be limited by the amount of time it takes for the underfill material 208 to fill the space between the chip 200 and the substrate 206. Since the flow rate of the liquid underfill material 208 is decreased as the percentage of filler material 218 by weight added to the underfill material is increased, the amount of time it takes for the underfill material to the fill the space between the chip 200 and the substrate 206 is increased and hence the process time is increased. Thus, in one embodiment of the present invention, the amount of filler material added to the underfill material during the flow process may be decreased or eliminated to reduce the process time for the underfill flow process.

The percentage by weight of filler material 218 added to the underfill material 208 increases the rigidity of the underfill material and hence the mechanical strength of the chip package 201. As described above, the mechanical strength requirements of the chip package 201 are greatest at the perimeter of the chip 230 and decrease as the center of the chip 216 is approached. Thus, in one embodiment of the present invention, the amount of filler material added to the liquid underfill material during the flow process may be increased to increase the rigidity of the hardened underfill material.

FIG. 2B shows a cross-sectional view of a semiconductor chip package 201 with a fillet 222 being added around the perimeter 230 of the chip 200. In the past, the fillet 222 has been added to provide a smooth edge between the chip 200 and the substrate 206 around the perimeter of the chip and provide additional strength to the chip package 201. Typically, the fillet 222 is added after the underfill material 208 has been added between the chip and the substrate.

In FIG. 2B, following the dispense process described with reference to FIG. 2A, a liquid fillet material 224 is being dispensed around the perimeter of the chip 200 and on top of the substrate 206 using a dispensing mechanism 228. The dispensing mechanism may be a needle, syringe or any other injection mechanism. In the present invention, the liquid fillet material 224 contains a percentage by weight of the filler material 226. The filler material 224 may be but is not limited to silica or alumina. The fillet material contains a higher percentage of filler material 226 by weight than the underfill material 208 between the chip and the substrate. The fillet material 224 may be a thermo-set epoxy, such as is available from Hysol Corporation of Industry, Calif., Ablestik Laboratories of Rancho Domingo, Calif., and Johnson Matthey Electronics of San Diego, Calif. The fillet material 224 may be the same or a different material than the underfill material 208 placed between the chip 200 and the substrate 206 during the underfill flow process described in FIG. 2A.

After the fillet material 224 with a percentage of filler material 226 by weight is placed around the perimeter of the chip 200 to form the fillet 222, the chip package 201 is heated to a temperature of about 150° C. for about 120 minutes to harden the thermo-set epoxy in the fillet and the underfill. While the chip package is being heated, filler material 226 from the fillet 222, which contains a higher percentage by weight of filler material than the underfill material 208, diffuses into the underfill material 208 between the chip 200 and the substrate 206. One criterion in selecting the fillet material 224 is that the filler material 226 can diffuse from the fillet 224 to the underfill material 226. For example, when the fillet material 224 and the underfill material are the same, but the fillets contains a higher percentage of filler material by weight, filler material 226 from the fillet 222 will diffuse at a rate that varies with time into the underfill material 208 until the filler material and underfill material have hardened. When the fillet material 222 and the underfill material 208 are different, but the fillet contains a higher concentration of filler material than the underfill material and the materials are diffusively compatible, then filler material 226 from the fillet 222 will diffuse at a rate that varies with time into the underfill material 208 until the filler material and underfill material have hardened.

A typical percentage of filler material 226 added to the fillet material 224 may be between 30–85% by weight with a preferred range between 60–80% by weight but is not limited to either of these ranges. As described above, a typical percentage by weight of the filler material 218 added to the underfill material in the flow process may be between 0–30%. Thus, the difference in the percentage by weight of the filler material in the fillet material 224 and in the underfill material 208 produces a concentration gradient that decreases from the chip perimeter 230 to the chip center 216. The rate of the diffusion at a given location is a function of the magnitude of the concentration gradient and increases when the gradient is larger. Thus, during the diffusion process, the rate of diffusion will vary from the chip perimeter 230 to the chip center 216 as a function of time as the filler material diffuses from regions with a high concentration of filler material to regions with a low concentration of filler material. The diffusion process may continue until the fillet material and underfill material harden.

The hardening process, which occurs as function of time and temperature as described above, is also called curing. When the fillet material and underfill material are cured, the diffusion rate is drastically reduced and the percentage of filler material at a given location remains relatively fixed in time but varies with location between the chip perimeter 230 and center 216. Thus, the final concentration of filler material at a given location after the fillet and the underfill materials have hardened may be modified by varying one or more of the following seven parameters that affect the diffusion and the curing process: 1) the initial percentage by weight of filler material 226 in the liquid fillet material 224, 2) the initial percentage of filler material by weight in the liquid underfill material, 3) the size of the filler material particles 226, 4) the curing time, 5) the curing temperature which may be varied as a function of time, 6) the temperature (e.g., about 70–110° C.) at which the substrate is heated during dispense of the underfill material, and 7) the post-heat temperature (e.g., about 70–110° C.) at which the substrate may be maintained for about 1–2 minutes following dispense.

Figure 3A:
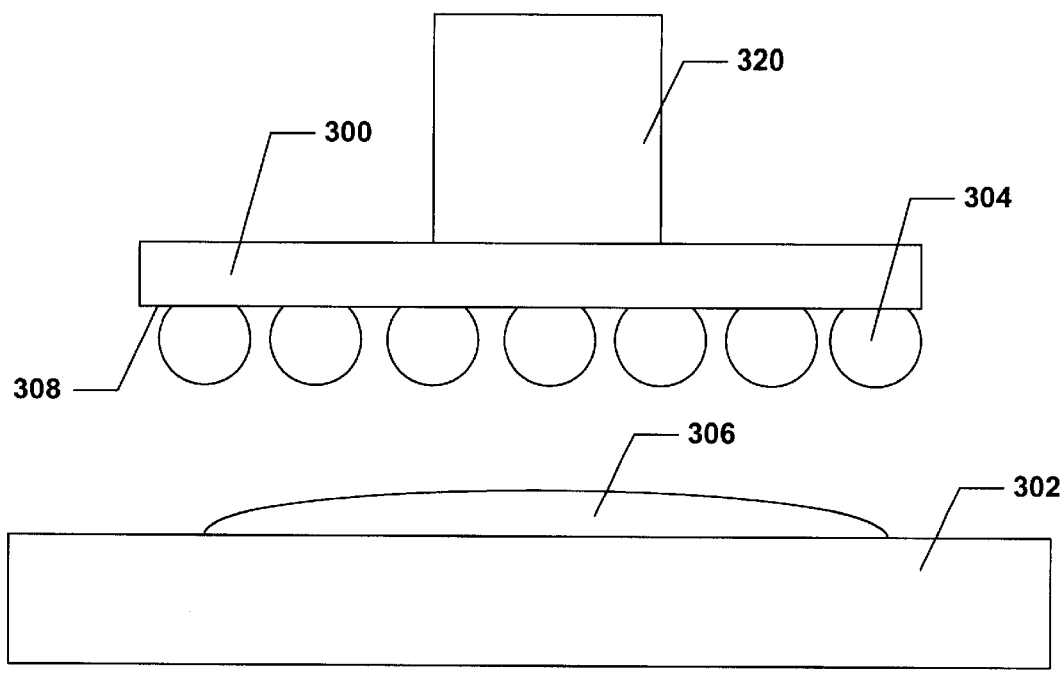
FIGS. 3A–B depict cross-sectional views of stages in the packaging of a chip using a no flow underfill with a highly filled fillet to add filler material to the underfill material in accordance with a preferred embodiment of the present invention.
Figure 3B:
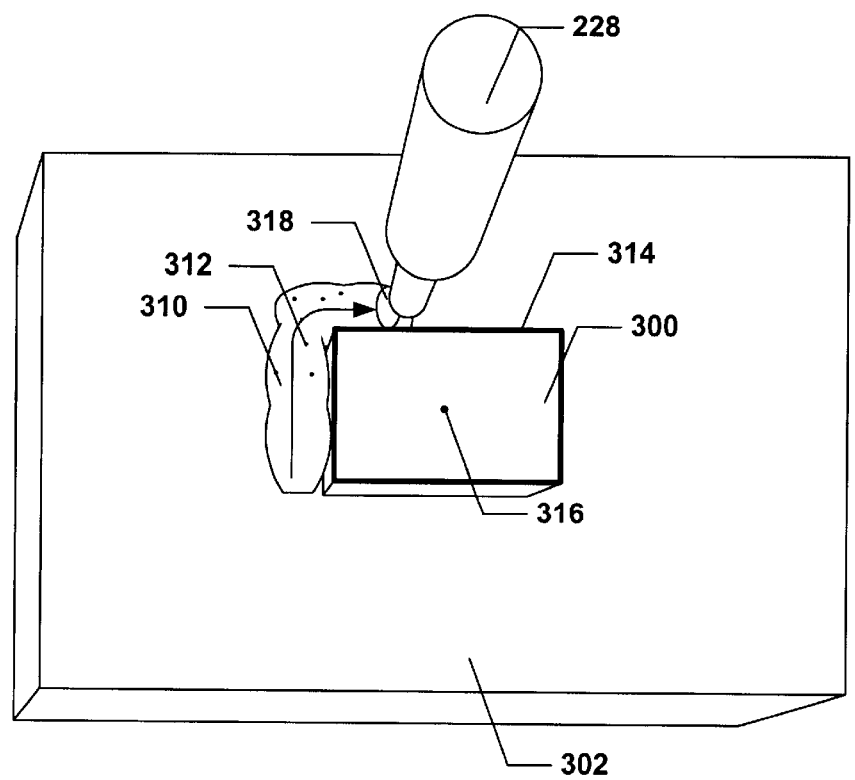

FIGS. 3A and 3B depict cross-sectional views of stages in the packaging of a chip using a no flow underfill with a highly filled fillet to add filler material to the underfill in accordance with a preferred embodiment of the present invention. FIG. 3A shows a chip 300, with solder balls 304 bonded to the active surface 308, before electrically bonding to a substrate 302. In this process, called a no flow underfill process, the solder flux available, for example, from Litton Kester Solder, Des Plaines, Ill., is combined with an underfill material to produce a flux/underfill material 306 and the underfill flow process described in FIG. 2A may be skipped. The solder flux may be combined with an epoxy, for example, a thermo-set epoxy, such as is available from Hysol Corporation of Industry, Calif., and Ablestik Laboratories of Rancho Domingo, Calif.

In the no flow underfill process, a chip 300 with solder balls may be placed on a substrate 302 where a flux/underfill material 306 has been dispensed onto to the substrate surface below the chip. The chip 300 may be placed on the substrate 302 surface using a vacuum wafer chuck 320 or some other device to hold the chip 300 in place. The chip 300 may be placed on the substrate surface such that the solder balls protrude through the flux/underfill material 306 to make contact with the electrical bonding pads (not shown) on the substrate surface 302. Later in the process, the chip 300 and substrate may then be run through a reflow furnace or some other heating mechanism to form good reflow joints as well as curing the underfill material in the flux/underfill material 306 to act as an underfill between the chip and the substrate. During the heating process, the chip and substrate may be subjected to a temperature profile which varies as a function of time. For example, the chip and substrate may be heated to the solder reflow temperature, which is about 220° C., for a period of time and then cured at the curing temperature, which is about 150° C., for a period of time.

In the no flow underfill process, it is typically not desirable to add a filler material to the flux/underfill material 306 because filler materials including alumina or silica can interfere with the electrical bonding of the solder balls 304 to the package substrate 302. The underfill material in the flux/underfill material 306 without filler material usually has a high CTE and low mechanical rigidity after hardening. Thus, under thermal cycling of the chip package, the underfill material in the flux/underfill material 306 may not provide enough mechanical rigidity to counter the mechanical stresses that the electrical connections encounter during thermal cycling. In the past, the no flow underfill process has usually only been employed for small chips or applications where thermal cycling or high reliability is not important.

FIG. 3B shows a fillet 310 being created around the perimeter 314 of a chip 300 in a process similar to the one described in FIG. 2B. The fillet material 318 contains a percentage by weight of filler material particles 312. The fillet material 318 may be a thermo-set epoxy as described in FIG. 2B and is selected such that the filler material particles can diffuse into the flux/underfill material 306 during the curing process. A typical percentage of filler material 312 added to the liquid fillet material 318 may be between 30–85% by weight with a preferred range between 60–80% by weight but is not limited to either of these ranges. Solder reflow and underfill curing is preferably accomplished in a single heating step having a temperature profile that rises high enough to reflow the solder (e.g., to about 220° C.) and then drops to an appropriate cure temperature for the underfill for a period of time sufficient to complete the curing. After the fillet material and underfill material are cured, the diffusion rate is drastically reduced and the concentration of filler material at a given location remains relatively fixed in time but the concentration of filler material varies with location between the chip perimeter 314 and center 316. Thus, the final concentration of filler material at a given location after the fillet and the underfill materials have hardened may be modified by varying one or more of the following six parameters that affect the diffusion and the curing process: 1) the initial percentage by weight of filler material 226 in the liquid fillet material 224, 2) the initial percentage of filler material by weight in the liquid underfill material, 3) the size of the filler material particles 226, 4) the curing time, 5) the curing temperature which may varied as a function of time, 6) the reflow/cure heating temperature profile.

Adding filler material in this manner as described herein, the no flow process may be potentially employed for larger chips and packaging applications requiring a higher level of reliability than in the past. Further, for some chip packaging applications, the no flow underfill process, with the invention described herein, may be used for applications where an underfill flow process was previously required. Thus, the overall process time for adding underfill material between the chip and the substrate may be reduced in some cases.

Figure 4:
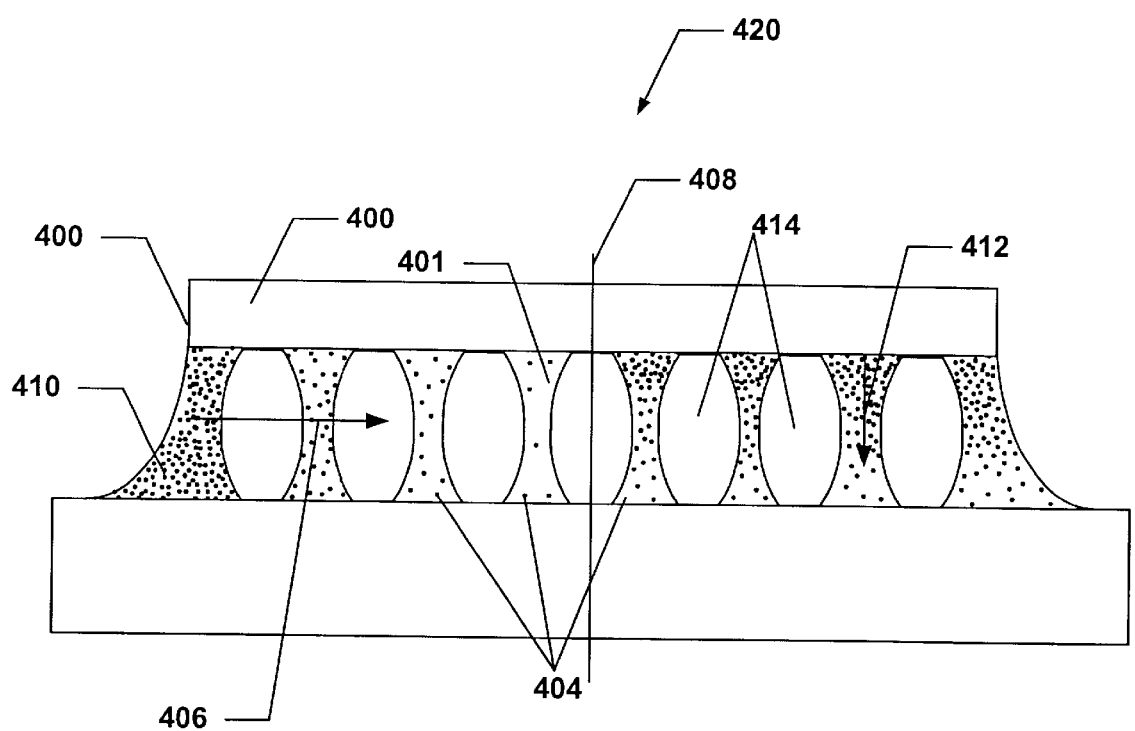
FIG. 4 depicts a cross-sectional view of a chip package with underfill material and a fillet after the curing process in accordance with preferred embodiments of the present invention.

FIG. 4 depicts a cross-sectional view of a chip package 420 with underfill material and a fillet after the curing process in accordance with preferred embodiments of the present invention. FIG. 4 shows examples of two types of gradients in the filler material that may be formed in a chip package using the present invention. The chip package 420 contains a chip 400 mechanically and electrically bonded to a package substrate 402 with a fillet 410 around the perimeter of the chip. The spaces or underfill between the chip 400, the substrate 402, and the solder balls 414 are filled with a hardened underfill material 401, such as a thermo-set epoxy as described above, containing a filler material 404 such as alumina or silica. The fillet 410 is also filled with a hardened material containing a filler material 404 such as alumina or silica.

The concentration of filler material within the hardened fillet material and the hardened underfill material may vary at a given location between the chip 400 and the substrate 402 to form a gradient of some type. As an example, the arrow 406 shows the concentration of filler material at a given location in the direction of the arrow decreasing from the fillet 410 towards the center of the chip 408. As described above, a concentration gradient of this type may be formed by having a higher percentage of filler material by weight in the liquid fillet material than in the liquid underfill material between the chip and the packaging substrate prior to curing. In another example, the arrow 412 shows the concentration of filler material at a given location in the direction of the arrow decreasing from the chip 400 to the substrate 402. A gradient of this type may be formed by changing the orientation of the chip package 420 during curing. For example, by curing the chip package 420 upside down with the gravity force acting in a downward direction through the center of the chip 408, the filler particles may settle near the chip 402 increasing the concentration of filler particles 404 in this region.

The ability to vary the concentration of filler material at a given location may be useful because the mechanical stresses under thermal cycling vary from location to location in the chip package. For example, as described above, the mechanical stresses in the chip package under thermal cycling usually vary from the chip center 408 to the chip perimeter 416 with the higher stresses typically occurring near the chip perimeter 416. Thus, using the process described in the present invention, the percentage of filler material at the chip perimeter 416 can be increased to increase the mechanical rigidity near the perimeter of the chip 416 where the stresses are highest. As another example, since the chip 400 typically has a lower CTE than the substrate 402, the concentration of the filler material by the chip 400 can be increased during the curing process, to better match the CTE of the chip, by changing the orientation of the chip package during the curing process. An advantage of this process, beyond those previously described, may be increased reliability of the chip package during thermal cycling because the mechanical rigidity of the underfill material can be adjusted from location to location to account for the variations in the mechanically stresses that vary from location to location in the chip package.

Figure 5:
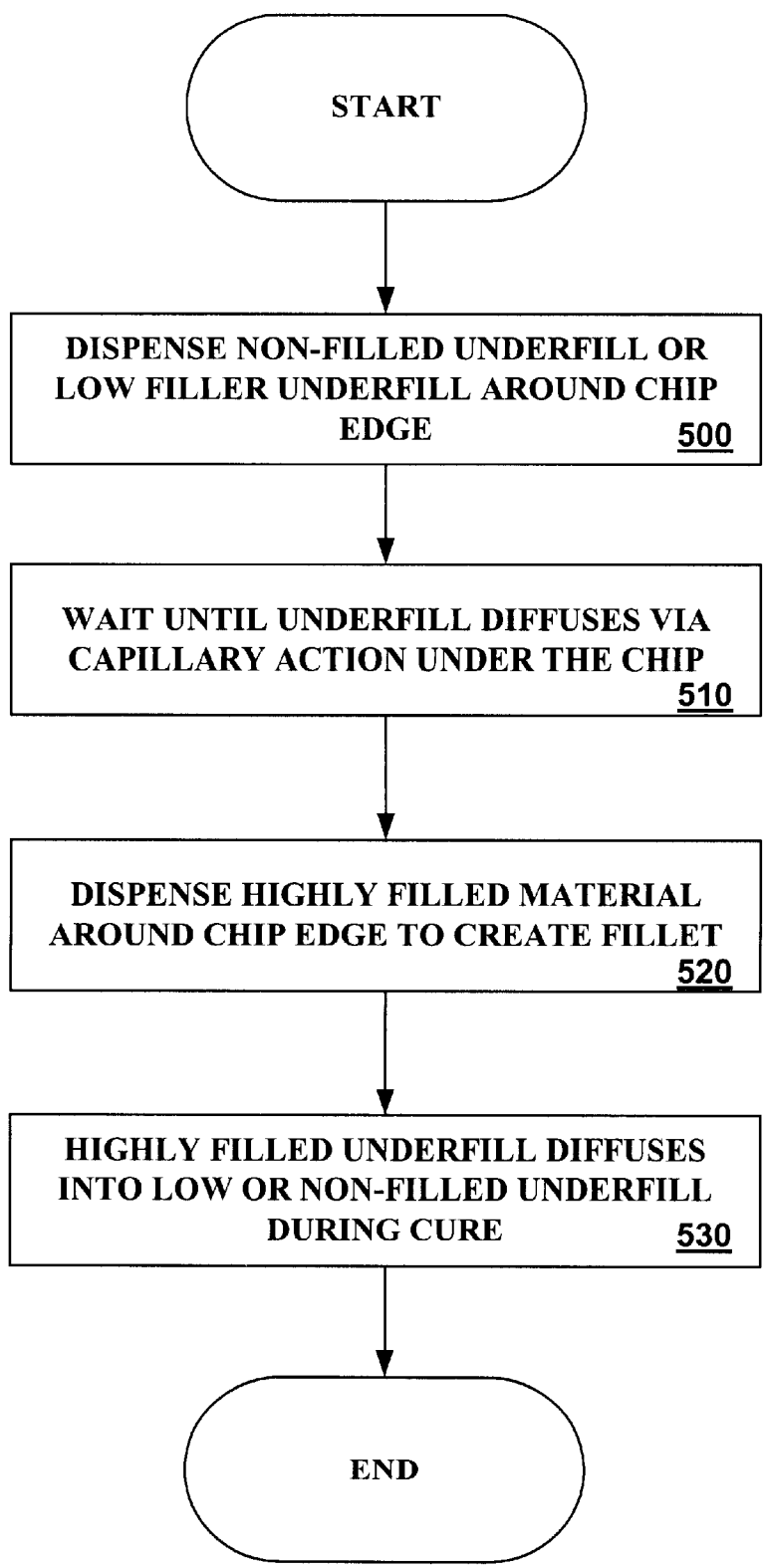
FIG. 5 depicts a flowchart showing steps of a method for adding filler material to a non-filled or low-filled underfill material deposited using a flow underfill process using a highly filled fillet during chip packaging in accordance with a preferred embodiment of the present invention.

FIG. 5 depicts a flowchart showing steps of a method for adding filler to a non-filled or low-filled underfill material deposited using a flow underfill process using a highly filled fillet during chip packaging in accordance with a preferred embodiment of the present invention. In step 500, as shown in FIG. 3A, a liquid non-filled or low-filled underfill material is dispensed around the edge of the chip. In step 510, the underfill material is drawn under the chip via capillary action. The capillary action may be augmented by applying a vacuum. After the underfill material has flowed underneath the chip to the chip perimeter, a liquid material with a higher percentage of filler material by weight than the liquid underfill material is dispensed around the edge of the chip to create a fillet in step 520. The fillet material, which may be the same or different than the underfill material, contains a higher percentage by weight of filler material when the materials are the same or may contain a higher concentration of filler material when the materials are different. In step 530, the filler material in the fillet material diffuses into the underfill material between the chip and the substrate during cure. The cure process might involve heating the chip and the substrate to a temperature which varies as a function of time. Upon hardening of the fillet and underfill material, the concentration of filler material at a given location remains relatively fixed. The percentage of filler material may vary from location to location within the underfill material and the filler material to form various gradients. Using this technique, the percentage of filler material may be varied to account for variations in the mechanical stresses that occur in the chip package during thermal cycling.

Figure 6:
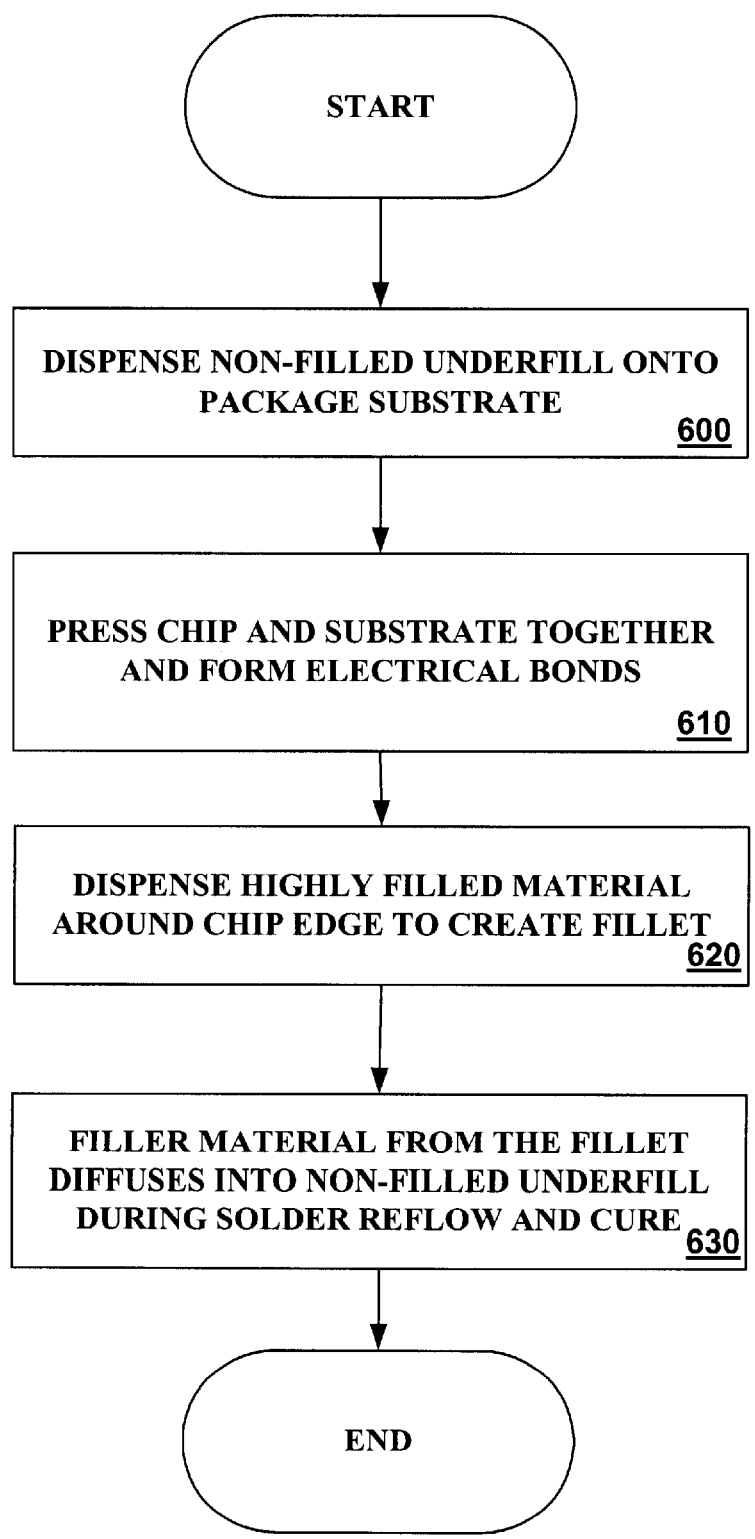
FIG. 6 depicts a flowchart showing steps of a method for adding filler material to a non-filled material deposited using a no flow underfill process using a highly filled fillet during chip packaging in accordance with a preferred embodiment of the present invention.

FIG. 6 depicts a flowchart showing steps of a method for adding filler to a non-filled or low-filled underfill material deposited using a no flow underfill process using a highly filled fillet during chip packaging in accordance with a preferred embodiment of the present invention. In step 600, a non-filled underfill material is dispensed onto the package substrate prior to the electrical bonding as shown in FIG. 3B. The underfill material is typically mixed with a flux material which may aid in the electrical bonding process. In step 610, the chip with solder balls pre-bonded onto the active surface of the chip is placed in contact the packaging substrate and the chip package is placed in a heating mechanism of some type to form the electrical bonds between chip and package substrate. The underfill material, after hardening, adds mechanical strength to the system. A sufficient quantity of underfill material is dispensed in step 600 such that the underfill material fills all the spaces between the chip and package substrate when the chip and the substrate are placed in contact to form the electrical bonds in step 610. Adding a filler material to the underfill material is undesirable at this step because the filler material may interfere with the electrical bonding. In step 620, a fillet material is dispensed around the edge of the chip to create a fillet as shown in FIG. 3B. The fillet material which may be the same or different than the underfill material contains a higher percentage by weight of filler material when the materials are the same or may contain a higher concentration of filler material when the materials are different. In step 630, filler material from the fillet diffuses into the non-filled underfill process during the solder reflow and the cure process. The diffusion process continues until the fillet material and the underfill material are cured. The end result of this process may be a chip package with a concentration of filler material which, varies from location to location within the underfill material and the fillet.

A few advantages but not all of the advantages of the invention described herein are as follows. First, the method of assembly produces a chip package where the concentration of filler material within the underfill material between the chip and package substrate may be varied from location to location within the underfill material. The filler material increases the mechanical rigidity of the underfill material after it has hardened. Using the approach of the present invention, the percentage of filler may be increased in regions of the underfill material where the mechanical stresses require a greater mechanical rigidity. Second, the method may be used to reduce the overall process time for adding underfill material between the chip and the substrate because the method may be used to add filler material to underfill material applied using the no flow underfill process. The no flow underfill process removes the step of applying the underfill material by flowing it between the chip and the substrate via capillary action.

Although the foregoing invention has been described in some detail for purposes of clarity of understanding, it will be apparent that certain changes and modifications may be practiced within the scope of the appended claims. Therefore, the present embodiments are to be considered illustrative and not restrictive, and the invention is not to be limited to the details given herein, but may be modified within the scope of the appended claims.

What is claimed is:

1. A semiconductor package, comprising;
    a packaging substrate having a top side and an underside;
    a semiconductor chip having an active surface with a center, a top surface and a perimeter said active surface of said chip electrically and mechanically bonded to the top side of said substrate;
    an underfill material between said chip and said substrate wherein the underfill material contains a percentage of filler material;
    a second material on top of the said substrate and around the perimeter of the said chip wherein the second material contains a higher percentage of filler material than the underfill material between said chip and said substrate.

2. The semiconductor package of claim 1 wherein the filler material is alumina or silica.

3. The semiconductor package of claim 1 wherein the second material on top of the said substrate and around the side of the said chip forms a fillet.

4. The semiconductor package of claim 1 wherein the underfill material between said chip and said substrate does not contain filler material.

5. The semiconductor package of claim 1 wherein the underfill material between said chip and said substrate contains up to about 30% by weight of filler material.

6. The semiconductor package of claim 1 wherein the second material on top of said substrate and around the perimeter of said chip contains about 30–85% by weight of filler material.

7. The semiconductor package of claim 6 wherein the second material on top of said substrate and around the perimeter of said chip contains about 60–80% by weight of filler material.

8. The semiconductor package of claim 1 wherein the chip and the substrate are separated by a gap about 25–50 microns wide.

9. The semiconductor package of claim 1 wherein the underfill material is a thermo-set epoxy.

10. The semiconductor package of claim 1 wherein the second material on top of said substrate and around the perimeter of said chip is a thermo-set epoxy.

11. The semiconductor package of claim 1 wherein the underfill material between said chip and said substrate contains a gradient of filler material wherein the gradient of filler material varies between the concentration of filler material around the perimeter of said chip and the concentration of filler material at the center of said chip.

12. The semiconductor package of claim 1 wherein the underfill material between said chip and said substrate contains a gradient of filler material wherein the gradient of filler material varies between the concentration of filler material at the active surface of said chip and the concentration of filler material at the top of said substrate.

13. A method of adding filler to an underfill epoxy for chip packaging comprising:

providing a packaging substrate having a top side and an underside and a semiconductor chip having an active surface with a center, a top surface, and a perimeter;

electrically bonding the active surface of said semiconductor chip to electrical traces on the top side of the said substrate;

dispensing an underfill material between said chip and said substrate wherein the underfill material contains a percentage of filler material;

dispensing a second material on top of the said substrate and around the perimeter of the said chip wherein the second material contains a higher percentage of filler material than the underfill material between said chip and said substrate;

curing said underfill material and said second material.

14. The method of claim 13 wherein the filler material is alumina or silica.

15. The method of claim 13 wherein the second material on top of the said substrate and around the perimeter of said chip forms a fillet.

16. The method of claim 13 wherein the underfill material between said chip and said substrate does not contain filler material.

17. The method of claim 13 wherein the underfill material between said chip and said substrate contains up to about 30% by weight of filler material.

18. The method of claim 13 wherein the second material on top of said substrate and around the perimeter of said chip contains about 30–85% by weight of filler material.

19. The method of claim 18 wherein the second material on top of said substrate and around the perimeter of said chip contains about 60–80% by weight of filler material.

20. The method of claim 13 wherein the chip and the substrate are separated by a gap about 25–50 microns wide.

21. The method of claim 13 wherein the underfill material is a thermo-set epoxy.

22. The method of claim 13 wherein the second material on top of said substrate and around the perimeter of said chip is a thermo-set epoxy.

23. The method of claim 13 wherein the underfill material between said chip and said substrate contains a gradient of filler material wherein the gradient of filler material varies between the concentration of filler material around the perimeter of said chip and the concentration of filler material at the center of said chip.

24. The method of claim 13 wherein the underfill material between said chip and said substrate contains a gradient of filler material after curing wherein the gradient of filler material varies between the concentration of filler material at the active surface of said chip and the concentration of filler material at the top of said substrate.

25. The method of claim 13 wherein the underfill material is dispensed prior to electrical bonding between said chip and said substrate and wherein the underfill material does not contain a filler material.

26. The method of claim 25 wherein the second material on top of said substrate and around the perimeter of said chip forms a fillet.

27. The method of claim 25 wherein the second material on top of said substrate and around the perimeter of said chip contains about 30–85% by weight of filler material.

28. The method of claim 27 wherein the second material on top of substrate and around the perimeter of said chip contains about 60–80% by weight of filler material.

29. The method of claim 27 wherein the filler material is alumina or silica.

30. The method of claim 25 wherein the chip and the substrate are separated by a gap about 25–50 microns wide.

31. The method of claim 25 wherein the underfill material is a thermo-set epoxy.

32. The method of claim 25 wherein the second material on top of said substrate and around the perimeter of said chip is a thermo-set epoxy.

* * * * *